July 19, 1966 F. W. DEHMELT ET AL 3,261,727

METHOD OF MAKING SEMICONDUCTOR DEVICES

Filed Dec. 3, 1962

Inventors:
FRIEDRICH WILHELM DEHMELT
GERHARD GRUST
BY: Spencer & Kaye
ATTORNEYS

United States Patent Office 3,261,727
Patented July 19, 1966

3,261,727

METHOD OF MAKING SEMICONDUCTOR DEVICES

Friedrich Wilhelm Dehmelt and Gerhard Grust, Ulm (Danube), Germany, assignors to Telefunken Patent-verwertungs-G.m.b.H., Ulm (Danube), Germany Filed Dec. 3, 1962, Ser. No. 241,847
Claims priority, application Germany, Dec. 5, 1961, T 21,226
24 Claims. (Cl. 148—175)

The present invention relates to the manufacture of semiconductor devices.

The high speeds at which switching transistors must be able to carry out the switching action makes it necessary that the collector barrier resistance be low, and transistors having a low collector barrier resistance can be obtained, for example, by making the collector zone very thin. In order to form this thin collector zone and hence obtain the low collector barrier resistance in the case of diffused base transistors, the same are manufactured by way of the so-called epitaxial method. The starting body is a low-ohmic monocrystalline semiconductor slab which itself must still be sufficiently thick to allow it to be worked. A very thin high-ohmic semiconductor layer, having a thickness of about 10 microns is deposited on this semiconductor slab by decomposition of a gaseous substance containing a semiconductor material. This high-ohmic layer constitutes the essential part of the transistor because the base and emitter zones are introduced into the high-ohmic epitaxial layer, which itself has the conductivity type of the collector zone. The advantage of this method is that the epitaxial layer which acts as a transistor and which itself would not be sufficiently stable from a mechanical point of view, is mounted on a low-ohmic carrier, namely, the starting body.

A high-ohmic silicon epitaxial layer can be applied onto a low-ohmic silicon body by decomposing a silicon-containing gas, as, for example, silicon tetrachloride or silicon chloroform, at temperatures of between 1000 and 1200° C. and depositing it on the low-ohmic silicon body. The deposited silicon grows on the low-ohmic silicon carrier body, in a monocrystalline manner, at a rate depending on the temperature and on the speed at which the gas to be decomposed flows. The same holds true for germanium or intermetallic compounds.

In carrying out this expitaxial method, care must be taken to see to it that the semiconductor layer deposited on the low-ohmic semiconductor carrier grows not only in a monocrystalline manner, but also that the layer obtains the desired conductivity. The value of the collector barrier resistance is determined by the ohmic resistance of the starting body. The low-ohmic starting body can, for example, consist of n-conductive silicon having a conductivity of about 0.001 ohm-cm. The silicon epitaxial layer of the same conductivity type applied onto such a carrier body has, in general, a thickness of 5 to 10 microns, is monocrystalline, and has a specific resistance of about 0.5 to 2 ohm-cm. The emitter and base zones are then introduced into the epitaxially applied high-ohmic silicon layer.

The above-described method involves certain difficulties, because it is not always possible to let the high-ohmic layer grow monocrystallinely and at the same time parallelly to the carrier body. It is especially difficult to impart to the epitaxial layer the precise conductivity required of the collector zone, because the doping is a function of the thickness of the layer. When an epitaxial layer of given conductivity type is applied onto a semiconductor of the same conductivity type, there will be no pn-junction between the high-ohmic epitaxial layer and the semiconductor carrier body, which would allow the thickness of the layer to be measured. Therefore, the thickness of the layer can be determined only by means of ultrared reflection measurements, such measurement, it should be noted, being possible only after the layer has finished growing on the carrier, so that once the layer has been applied to the carrier, it is inherently no longer possible to change the ohmic resistance of the already applied epitaxial layer.

It is, therefore, an object of the present invention to provide a method which overcomes the above-described drawbacks, and more particularly, to provide a method wherein that portion of the semiconductor in which the barrier layer is to be introduced has a predetermined, precisely fixed conductivity. In order to accomplish this result, the present invention resides in a method wherein a semiconductor layer is applied to one side of the surface of he semiconductor body, preferably by growing, the conductivity of which layer is greater than that of the semiconductor body, and wherein the zone or zones required for the semiconductor system is or are introduced into the actual semiconductor body, i.e., the starting body which itself forms one of the zones of the semiconductor device.

The additional semiconductor layer can be grown onto the original semiconductor crystal preferably by the known epitaxial method either monocrystallinely with the same crystal orientation, or it can be polycrystalline. The thickness of this semiconductor layer is preferably between 100 and 200 microns.

In general, the semiconductor on which the low-ohmic semiconductor layer is grown is thicker than desired. In that case, the side of the semiconductor body which is opposite to the side on which the semiconductor layer is applied, is, after the layer has been applied, taken down to the desired thickness, for example 10 to 20 microns. In the course of this taking down it must be seen to that the removal of the semiconductor material is done parallel to the surface of the original semiconductor surface. The material to be taken off can be removed in any suitable manner, as, for example, by etching or by lapping. Only then are the desired barrier layers introduced.

The above-described method has the substantial advantage that the semiconductor device obtained thereby has an extremely thin active semiconductor zone, i.e., an extremely thin barrier layer containing the semiconductor zone, which consists of the original semiconductor body and which is kept mechanically stable, i.e., strong, by a very low-ohmic grown semiconductor layer serving as a carrier.

In order to obtain a barrier resistance (which, in the case of transistors, may be referred to, for example, as the collector barrier resistance) which is as low as possible, it is expedient to dope the grown low-ohmic semiconductor layer to the point of degeneration.

The starting body, i.e., the semiconductor carrier body, will generally be a high-ohmic semiconductor body. The applied semiconductor layer can be of the same or of the opposite conductivity type as the carrier body.

A diffusion zone can be diffused into the semiconductor carrier body at the same time as the semiconductor layer is applied thereon, if the semiconductor material to be grown is mixed with suitable impurities and if the growth rate is suitably selected. If the diffusion zone diffused into the semiconductor during the application of an epitaxial layer is of a conductivity type opposite to that of the semiconductor body, the thus-obtained semiconductor is already suited for use as a diode. A silicon semiconductor diode can be obtained by means of this process by treating the epitaxial layer to be grown with phosphorus and by selecting the growth rate during the formation of the epitaxial layer such that the phosphorus present in the epitaxial layer to be grown diffuses into the semiconductor body out of the growing epitaxial layer.

According to the present invention, as explained above, it is not the low-ohmic semiconductor layer but the starting body onto which the low-ohmic semiconductor layer is applied which starting body serves as the actual semiconductor body into which, in the case of a transistor, the emitter and base zones are introduced. These emitter and base zones can, for example, be diffused into the semiconductor body. An oxide mask can be used for this purpose. Alternatively, it is possible to diffuse only the base zone into the semiconductor body, while the emitter zone is produced by alloying. The capacitance of the collector-side pn-junction can be reduced by subsequently etching the mesa, if the impurities were diffused into the whole surface of the semiconductor body without any oxide-mask.

In order to prevent growth on the surface of the semiconductor body which is opposite to the low-ohmic semiconductor layer during the application of the latter, the semiconductor body can be placed on a support plate, with this opposite surface in engagement with the support plate, before the semiconductor layer is grown onto the semiconductor by the epitaxial process. It is also possible to prevent the growth of a low-ohmic semiconductor layer on the mentioned opposite surface by providing the latter with a coating which prevents such growth. Such a coating can, for example, be an oxide coating such as $SiO_2$ 1 micron thick.

The present invention will now be described in conjunction with the accompanying drawings in which.

Figure 1:
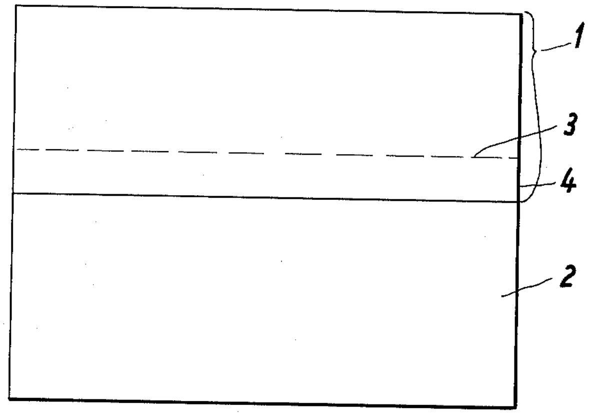
FIGURE 1 is a sectional view showing a semiconductor body carrying a semiconductor layer.

Referring now to the drawings, FIGURE 1 shows a relatively high-ohmic starting body 1 and a monocrystalline epitaxial layer 2 applied to a first surface of the body 1 by means of the epitaxial process. Alternatively, the layer 2 can be a low-ohmic polycrystalline semiconductor layer. The specific resistance of the semiconductor body, which consists of silicon and has a thickness of, for example, 150 microns, is approximately 0.5 to 1000 ohm-cm. The epitaxial layer 2, also consisting of silicon, is applied by depositing very low-ohmic silicon, doped with antimony, to a thickness of, for example, 100 to 150 microns. After the antimony-containing silicon epitaxial layer 2 has been grown onto the silicon body 1, the side opposite to that onto which the layer 2 was applied is taken down until the body 1 has a thickness of, for example, 10 to 20 microns. The taking down, done, for example, by lapping or by chemical or electrolytic etching, continues to the dashed line 3, so that the original body 4 is now reduced to what is indicated at 4.

Figure 2:
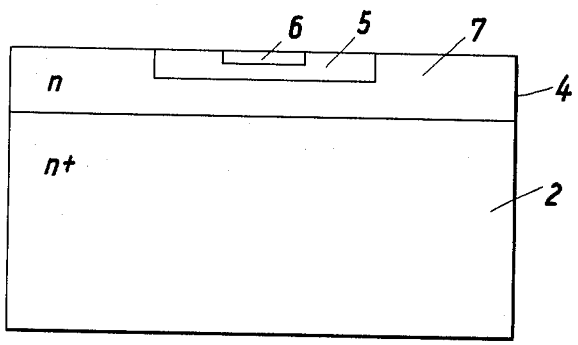
FIGURE 2 shows a planar-type transistor manufactured by the method according to the present invention.
Figure 3:
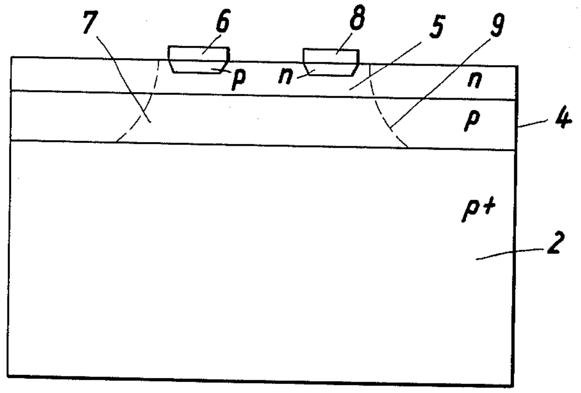
FIGURE 3 shows a mesa-type transistor manufactured by the method according to the instant invention.

The remaining portion 4 of the silicon starting body, carrying the epitaxial layer 2, can be made into a transistor by applying a base zone 5 and an emitter zone 6 into the high-ohmic silicon crystal 4, as shown in FIGURES 2 and 3. If the silicon crystal 4 is, for example n-conductive, then the emitter zone 6 will likewise be n-conductive while the base zone 5 will be p-conductive. Conversely, a p-conductive silicon crystal 4 will have a p-conductive emitter and an n-conductive base zone applied to it.

FIGURE 2 shows a so-called planar transistor in which both the base zone 5 and the emitter zone 6 are diffused into the silicon crystal 4. So much of the silicon crystal 4 as is not subjected to diffusion, i.e., the portion indicated at 7, constitutes the collector zone of the transistor.

FIGURE 3 shows a so-called mesa transistor in which the base zone 5 is produced by diffusion, while the emitter zone 6 is made by alloying. The base zone 5 is contacted by a base electrode 8. In order to reduce the capacitance of the collector-side pn-junction located between the base zone 5 and the collector 7, so much of the high-ohmic semiconductor 4 which lies laterally outside of the dashed line 9 is removed. If the base zone 5 of the mesa transistor is, for example, n-conductive, both the emitter zone 6 as well as the collector zone 7 will be p-conductive. The monocrystalline or polycrystalline epitaxial layer 2 will likewise be p-conductive, the conductivity of this layer 2, however, being substantially higher than the conductivity of the collector zone 7.

It will be noted that, according to the present invention, the emitter and base zones are introduced into the remaining high-ohmic portion 4 of the original semiconductor body 1. This is in contradistinction to the heretofore known processes in which it is epitaxial layer applied onto the original body that constitutes the actual semiconductor body which receives the semiconductor zones, such as the emitter and base zones. Therefore, it is absolutely essential that, for purposes of the prior art processes, the applied semiconductor layer be monocrystalline, whereas in the case of the present invention, the applied low-ohmic semiconductor layer can just as well be polycrystalline. The practical advantage of this is that a polycrystalline layer can be grown at a substantially faster rate than a monocrystalline epitaxial layer.

Another substantial advantage of the method according to the present invention is that the ohmic resistance of the starting body, which itself is not manufactured by means of an epitaxial process, as well as the thickness of the starting body can be preselected with great precision. The fact that the ohmic resistance as well as the thickness of the silicon body can be predetermined very accurately is of significance because, in contradistinction to the prior art processes, the starting body 1 constitutes a major component of the semiconductor device being manufactured, into which component the various zones, such as the base and emitter zones, are introduced.

Yet another advantage of a method according to the present invention over the prior art methods is that the ohmic resistance of the grown semiconductor layer 2 is generally not at all critical. All that is important is that the ohmic resistance of the semiconductor layer 2 be very low so as to obtain a low barrier resistance.

It will be understood that the above description of the present invention is susceptible to various modifications, changes, and adaptations, and the same are intended to be comprehended within the meaning and range of equivalents of the appended claims.

*Example 1*

A diode is made for example by using a silicon starting body of p-type having a total thickness of about 150$\mu$ and a resistivity of 1–1000 ohm-cm. corresponding to the wanted reverse voltage of the collector pn-junction. The epitaxial layer is build up with n-type silicon and doped to degeneration. This layer is made by using a $H_2$-gas flow of 50 1/hour whereby the $H_2$-gas is saturated with $SiCl_4$ at $-10°$ C. The $SiCl_4$ contains $PCl_5$ in a concentration of about 0.01%. The thickness of the starting body is then reduced to about 20–50$\mu$ by chemical etching. During epitaxial growth the phosphorus diffuses into the starting body at 1250° C. during one hour. From this diffusion results a n-layer of about 7$\mu$ thickness in the monocrystalline starting body. The epitaxial layer has a growth rate of about 2.5$\mu$/minute during one hour.

*Example 2*

A n-p-n-transistor according to FIGURE 2 is made by using a silicon starting body 1 of n-conductivity having a total thickness of 150–200 microns. The epitaxial layer 2, also consisting of silicon of n-conductivity, is applied by using silicon tetrachloride in $H_2$-gas having a flow velocity of 50 1/hour. The $H_2$-gas is saturated at −10° C. with $SiCl_4$ containing $AsCl_3$. The growth rate is about 2.5μ/minute for 1 hour. The thickness of body 1 is then reduced, by electrolytic etching, to a thickness of 10–20 microns. The p-conductive base zone 5 is produced by boron diffusion with oxide-mask whereafter the n-conductive base zone 6 is produced by phosphorus diffusion with the help of an oxide-mask.

*Example 3*

A mesa-transistor according to FIGURE 3 is made by using a silicon starting body 4 of p-type with about 1 ohm-cm. having a total thickness of about 150μ. The epitaxial layer 2 of silicon consists of the same conductivity type as the starting body and is p-doped up to degeneration.

The layer 2 is applied by using $SiCl_4$ having a flow 50 1 $H_2$/hour, where the $H_2$-gas is saturated at −10° C. with $SiCl_4$ containing $BCl_3$ up to 0.01%. After the epitaxial growth the starting body is reduced to 20–30μ by lapping and etching. The boron diffuses into the p-type starting body during epitaxial growth on 1250° C. during one hour about 7μ deep. Then phosphorus is diffused into the opposite surface of the starting body at 1120° C. for two hours about 3μ deep. From the starting body 1 micron is then taken away on the opposite side by etching, after which the emitter is alloyed with aluminum which was first evaporated on the n-type surface.

What is claimed is:

1. A method for making a semiconductor device having a plurality of zones of different conductivity types, comprising the steps of:

(a) applying onto a first surface of a high-ohmic semiconductor starting body a semiconductor layer which is low-ohmic and thus has a conductivity greater than that of said starting body for providing a supporting carrier for said starting body, said starting body itself forming a zone of one conductivity type;

(b) removing material from that side of said starting body which is opposite said first surface thereof for reducing the thickness of said starting body down to that required for the particular semiconductor device being made, in consequence of which said starting body is left with an exposed second surface which is opposite to said first surface; and (c) bringing into said second surface of said starting body at least one other zone which is of the opposite conductivity type and outside of said semiconductor layer.

2. A method as defined in claim 1 wherein said semiconductor layer is applied by growing the same onto said semiconductor body.

3. A method as defined in claim 2, wherein said semiconductor layer has a thickness of between 100 and 200 microns.

4. A method as defined in claim 2 wherein said semiconductor layer is an epitaxial layer.

5. A method as defined in claim 2 wherein said semiconductor layer is polycrystalline.

6. A method as defined in claim 2 wherein said low-ohmic semiconductor layer is doped to the point of degeneration.

7. A method as defined in claim 1 wherein said semiconductor device is a transistor and wherein the semiconductor body has a conductivity type corresponding to that of the collector zone of the transistor.

8. A method as defined in claim 1 wherein said semiconductor body and said semiconductor layer are of the same conductivity type.

9. A method as defined in claim 1 wherein said semiconductor body and said semiconductor layer are of different conductivity type.

10. A method as defined in claim 1 wherein said semiconductor body is reduced parallelly to original configuration so that said second surface to which said zone is applied during said step (c) is parallel to the original opposite surface.

11. A method as defined in claim 1 wherein the material is removed by lapping.

12. A method as defined in claim 1 wherein the material is removed by etching.

13. A method as defined in claim 1 wherein said zone is brought into the semiconductor body by diffusion.

14. A method as defined in claim 1 wherein said zone is brought into said semiconductor body by alloying.

15. A method as defined in claim 7 wherein emitter and base zone are diffused into said semiconductor body with the help of an oxide mask.

16. A method as defined in claim 7 wherein a base zone is diffused into said semiconductor body and an emitter zone is alloyed to said semiconductor body.

17. A method as defined in claim 1 wherein the semiconductor device is a transistor of the mesa-type, and wherein said method comprises the further step of etching the mesa.

18. A method as defined in claim 1 wherein the surface of said semiconductor body which is opposite to said first surface thereof, during said applying step (a), is in engagement with a plate upon which said body is supported, thereby preventing the formation of the low-ohmic semiconductor layer on said opposite surface.

19. A method as defined in claim 1 wherein the surface of said semiconductor body which is opposite to said first surface thereof is provided with a coating which prevents the formation of the low-ohmic semiconductor layer on said opposite surface.

20. A method as defined in claim 19 wherein said coating is an oxide.

21. A method for making a semiconductor device having a plurality of zones of different conductivity types, comprising growing onto the surface of a high-ohmic semiconductor body, which itself forms a zone of one conductivity type, a semiconductor layer which is low-ohmic and thus has a conductivity greater than that of said semiconductor body for providing a supporting carrier for said starting body, said semiconductor layer being provided with impurities and being grown onto said semiconductor body at a rate for diffusing a diffusion zone into said semiconductor body during the growing of said semiconductor layer; and removing material from that side of said starting body which is opposite said first-mentioned surface thereof for reducing the thickness of said starting body down to that required for the particular semiconductor device being made.

22. A method as defined in claim 21 wherein the zone diffused into said semiconductor body is of the opposite conductivity type.

23. A method as defined in claim 22 wherein the semiconductor device being made is a diode.

24. A method as defined in claim 22 wherein said semiconductor body is a p-conductive silicon body, wherein said semiconductor layer is an epitaxial layer doped with phosphorus, and wherein the epitaxial layer is formed at a growth rate for diffusing the phosphorus of said layer into said semiconductor body.

References Cited by the Examiner

UNITED STATES PATENTS 2,561,411 7/1951 Pfann ______________ 148—187

(Other references on following page)

UNITED STATES PATENTS

| | | | |
|---|---|---|---|
| 2,692,839 | 10/1954 | Christensen et al. | 148—175 |
| 2,967,793 | 1/1961 | Philips | 148—186 |
| 2,981,877 | 4/1961 | Noyce | 148—187 |
| 2,985,804 | 5/1961 | Buie | 148—186 |
| 3,028,529 | 4/1962 | Belmont et al. | 148—186 |
| 3,063,879 | 11/1962 | Strull | 148—186 |
| 3,067,485 | 12/1963 | Ciccolella et al. | 148—186 |
| 3,108,914 | 10/1963 | Hoerni | 148—186 |

OTHER REFERENCES

"Epitaxial Process to Take Leading Role," Electronic Design, Nov. 23, 1960, pp. 37–39.

"Epitaxial Process Improves Transistor," Electronics, Mar. 3, 1961, pp. 52–53.

Theurer et al.: Letter in the Proceedings of the IRE, vol. 48, September 1960, pp. 1642–1643.

DAVID L. RECK, *Primary Examiner.*

N. F. MARKVA, *Assistant Examiner.*